United States Patent [19]
Padgaonkar et al.

[11] Patent Number: 5,212,780
[45] Date of Patent: May 18, 1993

[54] SYSTEM FOR SINGLE CYCLE TRANSFER OF UNMODIFIED DATA TO A NEXT SEQUENTIALLY HIGHER ADDRESS IN A SEMICONDUCTOR MEMORY

[75] Inventors: Ajay J. Padgaonkar, Phoenix; Sumit K. Mitra, Tempe, both of Ariz.

[73] Assignee: Microchip Technology Incorporated, Chandler, Ariz.

[21] Appl. No.: 191,983

[22] Filed: May 9, 1988

[51] Int. Cl.⁵ .............................................. G06F 5/01
[52] U.S. Cl. ............................. 395/425; 365/189.04; 364/DIG. 1; 364/244.3; 364/251.1; 364/260
[58] Field of Search ................................ 364/200, 900; 365/230.08, 230.06, 189.04, 230.04, 230.09; 395/800, 425

[56] References Cited

U.S. PATENT DOCUMENTS

| | | | |
|---|---|---|---|
| 4,159,540 | 6/1979 | Smith et al. | 365/230.08 |
| 4,201,105 | 5/1980 | Alles | 84/1.01 |
| 4,392,123 | 7/1983 | Brüggemann | 340/347 |
| 4,447,878 | 5/1984 | Kinnie et al. | 364/200 |
| 4,467,419 | 8/1984 | Wakai | 364/200 |
| 4,553,203 | 11/1985 | Rau et al. | 364/200 |
| 4,589,067 | 5/1986 | Porter et al. | 395/800 |
| 4,609,996 | 9/1986 | Kummer | 364/900 |
| 4,773,048 | 9/1988 | Kai | 365/230 |
| 4,773,049 | 9/1988 | Takemae | 365/230.06 |
| 4,924,432 | 5/1990 | Asai et al. | 364/900 |
| 4,964,037 | 10/1990 | Woods et al. | 364/200 |
| 5,001,665 | 3/1991 | Gergen et al. | 364/900 |

OTHER PUBLICATIONS

General Instrument, "DSP320C10 Digital Signal Processor," pp. 1-26, 1986.

*Primary Examiner*—Lawrence E. Anderson
*Assistant Examiner*—Richard Lee Ellis
*Attorney, Agent, or Firm*—Leitner, Greene & Christensen

[57] ABSTRACT

The RAM includes sub-arrays having odd and even memory locations, respectively. A data move instruction results in externally generated row and column address signals which are decoded to cause a first memory location, in one of the sub-arrays, to be selected and data to be read. The next memory location in sequence, in the other of the sub-arrays, is then selected, without necessity for an additional set of row address signals, for writing of the read information. The row decoder includes row indexing circuitry actuatable upon receipt of a shift signal signifying that the first memory location is in the last column of a given row. When the shift signal is received, the write location is automatically selected to be in the succeeding row.

4 Claims, 4 Drawing Sheets

SYSTEM FOR SINGLE CYCLE TRANSFER OF UNMODIFIED DATA TO A NEXT SEQUENTIALLY HIGHER ADDRESS IN A SEMICONDUCTOR MEMORY

BACKGROUND OF THE INVENTION

The present invention relates to electronic memories and more particularly to a random access memory (RAM), designed for use in a digital signal processor, which has a unique structure permitting simplified addressing for movement of data.

A digital signal processor is a high speed microcomputer capable of performing a variety of specialized functions requiring digitally adaptive, secure and intelligent signal processing. Examples of such applications are pattern recognition, adaptive control storage, intelligent finite impulse response filtering, linear circuit control, encryption algorithm execution, diagnostics, precision servo control and voice band data processing. Such processors find use in industrial robots, modems and direct broadcast satellite signal encryption systems.

One example of a digital signal processor which is currently commercially available is manufactured and distributed by the Microchip division of General Instrument Corporation at 767 Fifth Avenue, New York, N.Y. and designated as DSP 320C10. This processor has separate program and data memories which permit coefficients stored in the program memory to be read into the data memory, eliminating the need for a separate coefficient read only memory. A barrel shifter shifts data through the processor which includes an arithmetic logic unit and an accumulator. A multiplier is included which can perform a multiplication in a single 160 ns cycle. Auxiliary registers provide indirect data RAM addresses. Special hardware is employed so that the registers can be configured in an autoincrement-/decrement mode for single-cycle manipulation of data tables.

This processor is equipped with a 1536 word mask programmable read only memory (ROM). It can also execute instructions from an additional 2560 words of off chip memory, at full speed. A 144 word data RAM is provided.

The present invention relates to an improved digital signal processor which employs the same basic architecture as the DSP320C10 but includes 2.5K words of electronically erasable programmable read only memory (EEPROM) instead of the 1.5K words of mask programmable ROM and a larger RAM, 256 words as compared to 144. In particular, it relates to one of several improvements in the processor directed at providing enhanced operating characteristics through expansion of the RAM structure.

Certain processing applications require repeated moving of data from one designated memory location to another. For example, in implementing certain algorithms in finite impulse response filters, values for different time slots are sampled and stored in memory as the weighted sum thereof is calculated. Each value is shifted to a new location in the memory, preferably the next memory location in sequence, after each time slot. Thus, a new value for the current slot is added at the beginning of the memory chain as the oldest value is deleted from the end of the memory chain. The weighted sum is then calculated and stored. Hence, at the end of each time slot, the data at each memory location must be transferred to a different (next) memory location and the weighted sum calculated. This data movement requires the execution of a read command, relative to a first designated memory address, and then the execution of a write command, relative to a second designated memory address.

In the commercially available GI digital signal processor, a single continuous RAM decoder circuit was used for this purpose. During the first half of the time cycle, a first address is decoded, located and the data therein is read. At the same time, the second address is calculated. During the second half of the time cycle, the second address is decoded, located and the data written therein. This is a straightforward way of handling the shifting problem.

SUMMARY OF THE INVENTION

In the improved digital signal processor, it was desired to increase the capacity and hence the size of the RAM and, at the same time, maintain optimum processing speed. One possible approach was to physically expand the RAM array vertically on the chip and retain the above-described decoder scheme. However, this produces a physical aspect ratio unwieldy to manufacture. Instead, it was decided to divide the RAM physically into two halves, each capable of storing 128 words. One half contains all of the even addresses, the other half contains all of the odd addresses.

Separating the RAM into halves produced two sub-arrays. Each with 32 rows of four memory locations. It also required two separate sets of row and column decoders. Having two sets of decoders meant that the decoder associated with the location to be read and the decoder associated with the location to be written (which are always associated with different halves of the memory) could both be addressed simultaneously, at the beginning of the cycle. Both addresses were known as soon as the first address was known because the write location was the same as the read location address, plus one. This permitted an extra one half cycle of time for decoding the address of the write location, as compared to the previous RAM decoder system.

The improved RAM format requires a row index or shift after every eight addresses because each row contains eight columns and memory locations. Thus, after eight addresses, the next location in sequence lies in the first column of the next row. Special row decode circuitry is required in the row decoder associated with the even half of the RAM such that if the last column of a row is addressed for reading, the first column of the next row in succession will be automatically addressed for writing. The new decoders on the odd half of the RAM function as standard row decoders. All of the row decoders include standard row address signal decode circuitry, including two NAND gates feeding a NOR gate in a known configuration. Each also includes row shift circuitry responsive to a shift signal. However, shift signals are only provided to those row decoders in the even sub-array.

The present invention relates to the overall structure of the RAM and, in particular the structure of the row decoder circuits which serve to index the row address to shift rows automatically, when necessary, such that the data moving operation can be accomplished with a single set of row address signals. In this way, the maximum RAM speed, approximately 50 ns access time, can be maintained. Other aspects of the improved digital signal process are disclosed in Ser. No. 189,189, Filed May 2, 1988 and entitled "Security for the Internal Program Memory of a Digital Signal Processor" and Ser. No. 191,984 Filed May 9, 1988 entitled "Run Time Programming For Internal Program Memory Of A Processor". The reader is referred to these applications for further information.

It is, therefore, a prime object of the present invention to provide a digital signal processor with an expanded and improved random access memory.

It is another object of the present invention to provide a horizontally expanded random access memory array for use in a digital signal processor which is divided into two halves, one of which contains even memory locations and the other of which contains odd memory locations.

It is another object of the present invention to provide a high speed random access memory capable of executing an instruction to move data from one location of the memory to the other in a single address cycle.

It is another object of the present invention to provide a random access memory capable of moving data from one location to another through the decoding of a single set of row address signals.

It is another object of the present invention to provide a row decoder for use with a random access memory which includes automatic row shift logic.

It is another object of the present invention to provide a row decoder for a random access memory in which the automatic row shift logic, when actuated, causes the row address to automatically shift from one row to the subsequent row.

In accordance with the present invention, a random access memory is provided comprising a matrix array of memory locations. Each of the memory locations has an address. The array is divided into first and second sub-arrays comprising odd and even locations, respectively. Row address decoder means are associated with each sub-array. The row address decoder means is adapted to receive an externally generated set of row address signals associated with a first memory location, in one of said sub-arrays and, in response thereto, to access the row of the first memory location to permit reading of the data in the first memory location and to select the row of next memory location, in sequence, which will always be in the other sub-array, for permitting writing the read data therein.

The row decoder means comprises row address signal gating means and row indexing means. The row indexing means is actuatable by a shift signal signifying that the first memory location is in the last column of a given row. It functions to select the next memory location to be in the row succeeding the given row. This shift is accomplished without the necessity of an additional, externally generated, set of row address signals.

The row indexing means comprises a row select input connected to the gating means, a row select output connected to the row bus, a shift connect input connected to the previous row decoder and a shift connect output connection to the next row decoder in sequence. Means, responsive to the actuation of the row select input, are provided for operably connecting the row select output and a first voltage source so as to deenergize the shift select output, and to maintain the row select output of the row decoder means associated with the next successive row at zero volts, during a first time period. During a second time period, upon receipt of the shift signal, this means maintains the row select output at zero volts and energizes the shift connect output to operably connect the row select output of the row decoder associated with the next successive row and the first voltage source.

The connecting means comprises first and second complimentary switch means each having a control terminal and an output circuit. The output circuits are operably connected in series between the first and a second voltage source. The row select output is operably connected between the output circuits. The control terminal of the first timing signal, present between the time periods, to actuate the first switch means. The control terminal of the second switch means is operably connected to the shift connect input.

The connecting means further comprises third, fourth, fifth and sixth switch means, each having a control terminal and an output circuit. The output circuits are operably connected in series between the first and second voltage sources. The third and sixth switch means are complimentary and have their control terminals respectively operably connected to receive a second timing signal. The control terminal of the fourth switch means receives the shift signal. The control terminal of the fifth switch means is operably connected to the row select input. The junction between the output circuits of the fourth and fifth switch means is operably connected to the control terminal of the second switch means and to the shift connect input. The junction between the output circuits of the fifth and sixth switch means is operably connect to the shift connect output.

The connecting means further comprises a seventh switch means having an output circuit operably connected between the junction between the output circuits of the firth and sixth switch means, on the one hand, and the shift connect output on the other hand. The control terminal of the seventh switch means is operably connected to receive the complement of the shift signal.

The gating means comprises NAND gate means adapted to receive a set of row address signals and NOR gate means. The NOR gate means is operably connected to the output of the NAND gate means. The output of the NOR gate means forms the row select input.

Means are provided for generating a four cycle timing signal. The shift signal is active for two of the four cycles and coincides with the second time period.

In accordance with another aspect of the present invention, a method is provided for moving data between memory locations in a matrix array. The matrix array is divided into first and second sub-arrays having odd and even memory locations, respectively. A single set of row address signals is all that is required to perform the data moving operation. The method comprises steps of: addressing a first memory location, in one sub-array, in accordance with the set of row address signals. The data from the first memory location is read. The next location, in sequence, in the other sub-array, is selected by shifting to the next row in succession, if the first memory location was located in the last column of the previous row. The read data is written into the selected memory location.

Addressing the first memory location comprises the step of energizing the select bus associated with row of the first memory location if the set of row address signals selects same and a shift signal is absent.

The step of selecting the next memory location in sequence comprises the steps of deenergizing the select bus associated with the row of the first memory location, maintaining the select bus associated with the row of the first memory location in the deenergized condition during the shift signal. The select bus associated with the next row in succession is energized during the shift signal.

The step of energizing the select bus associated with row of the first memory location comprises the steps of operably connecting same to a voltage source at a first voltage level through the output circuit of a transistor. The control terminal of the transistor is operably connected to the second voltage source which is at a second (ground) voltage level.

The step of deenergizing the select bus associated with row of the first memory location comprises the step of operably connecting same to the second voltage source.

The step of energizing the select bus associated with the next row comprises the steps of operably connecting the select bus to the first voltage source through a transistor in the row decoder associated with the row of the first memory location. This transistor has a control terminal which is operably connected to the second source, during the presence of the shift signal.

BRIEF DESCRIPTION OF THE DRAWINGS

To these and such other objects which may hereinafter appear the present invention relates to a method and apparatus for moving data in the RAM of a digital signal processor as set forth in detail in the following specification and recited in the annexed claims taken together with the accompanying where like numerals refer to like parts and in which:

DESCRIPTION OF THE PREFERRED EMBODIMENT AND METHOD

Figure 1:
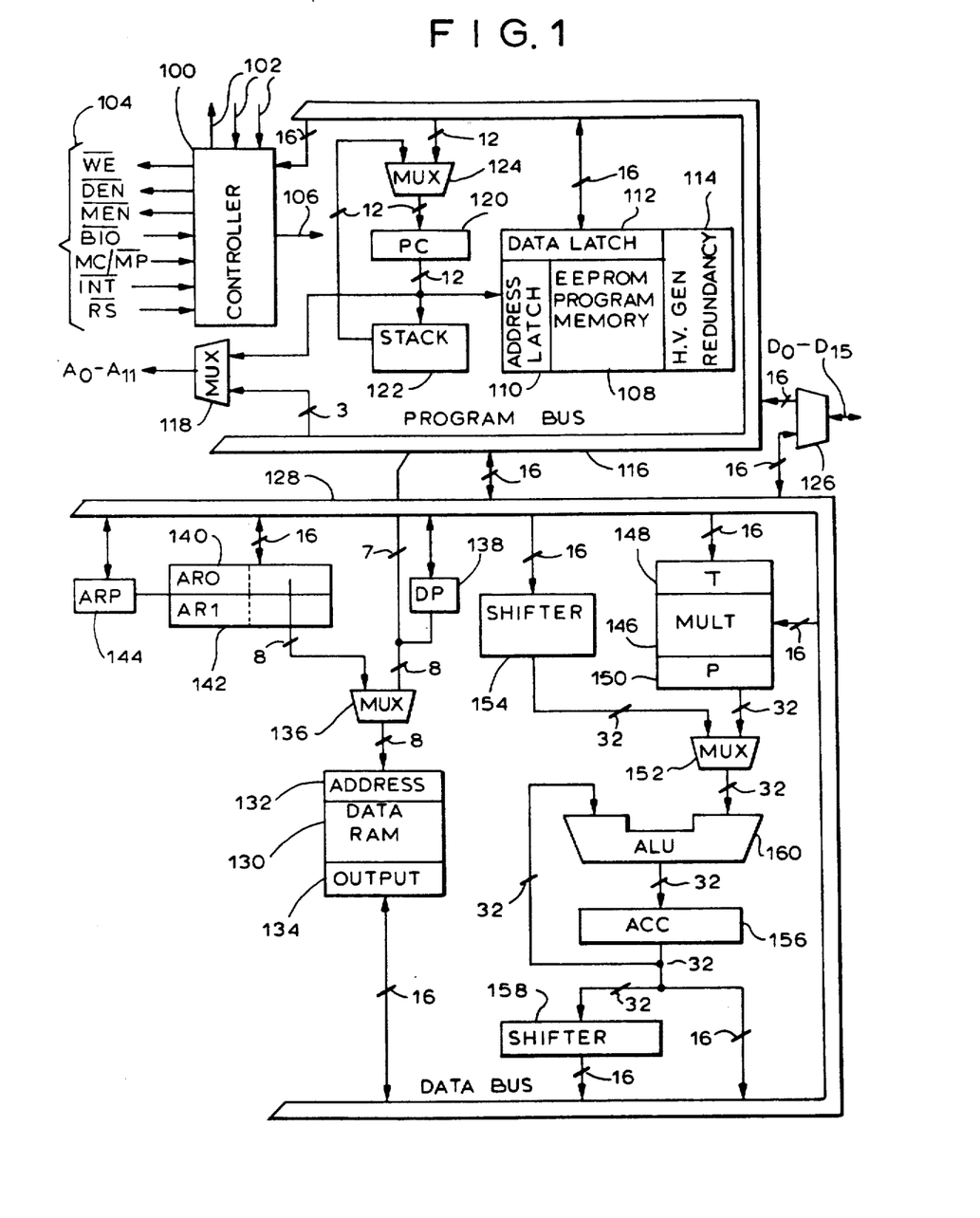
FIG. 1 is a block diagram showing the basic components of the digital signal processor of which the RAM of the present invention is a part.

FIG. 1 is a diagram illustrating the functional blocks and basic architecture of the digital signal processor. In the diagram, the various buses are provided with numbers which signify the number of parallel connections in each.

The processor utilizes a modified Harvard architecture for speed and flexibility. In a strict Harvard architecture, program and data memories lie in two separate spaces, permitting a full overlap of fetch and execution. The modification of the Harvard architecture employed herein allows transfers between program and data space, thereby increasing flexibility. This modification permits coefficients stored in the program memory to be read into the RAM, eliminating the need for a separate coefficient ROM. It also makes available subroutines based on computed values.

The processor includes a controller circuit 100 having two clock inputs and a clock output 102 and various control inputs and outputs 104, including $\overline{RS}$ (reset), $\overline{INT}$ (interrupt), $\overline{BIO}$ (bit test), $\overline{MEN}$ (memory enable to accept external memory instruction), $\overline{WE}$ (Write enable—indicates valid data input), MC/$\overline{MP}$ (mode select), $\overline{DEN}$ (data enable to accept external input data). Controller 100 also has an output 106 which controls the operation of an internal program memory in the form of a 2.5K word EEPROM (electronically erasable and programmable read only memory) 108.

EEPROM 108 has associated with it the appropriate address circuitry 110, instruction transfer circuitry 112 and related circuits 114 such as a high voltage generator and redundancy circuits. A program bus 116 is connected to controller 100 and to an output multiplex circuit 118 which provides external addresses for use by an external program source. The other input to multiplex circuit 118 is the output of a program counter circuit 120, which is also connected to address circuit 110 and to the input of a stack 122. Stack 122 saves the contents of program counter 120 during interrupts and subroutine calls.

The output of stack 122 is fed back to one of the inputs to a multiplex circuit 124. The other input of circuit 124 is connected to program bus 116. Program bus 116 is also connected to a multiplex circuit 126 which acts as an input/output port for data.

A data bus 128 is connected directly to program bus 116 for data transfer therebetween. Bus 116 is additionally connected to data input/out multiplex circuit 126. Data bus 128 can be utilized to perform input/output functions at burst rates of 50 million bits per second. Available for interfacing to peripheral devices are 128 input and 128 output bits consisting of eight 16 bit multiplex input ports and eight 16 bit multiplex output ports.

Data bus 128 is connected to a 256 bit data RAM (random access memory) 130. Thus, data transfer is possible between RAM 130 and EEPROM 108.

Several options are possible with respect to the addressing of data RAM 130. The data RAM 130 has address circuitry 132 and output circuitry 134 associated therewith. The address input to RAM 130 is provided via a multiplex circuit 136 which has an input directly from program bus 116 which is also fed by a data page pointer 138. The other input to multiplex circuit 136 is the output of a pair of auxiliary registers 140 and 142 which are connected to an auxiliary pointer 144.

Three main addressing modes are available. The RAM can be addressed directly. In this mode, the bits of the instruction word are concatenated with the data page pointer forming the data memory address. This implements a paging scheme in which a first page contains 128 words and a second page contains another 128 words. In a typical application, infrequently accessed variables, such as those used for servicing an interrupt, may be stored on the second page. In this case, seven bits of data memory address are required to directly address up to 128 words (the first page) of the data memory. Use of the data memory page pointer 138 is required to address the full 256 words.

In the indirect addressing mode, the data memory address is formed from the least significant eight bits of the two auxiliary registers 140 and 142. The auxiliary register pointer 144 selects the current auxiliary register. The auxiliary registers can be automatically incremented or decremented in parallel with the execution of any indirect instruction to permit single cycle manipulation of data tables. A special "immediate" set of instructions can be used to derive data from part of the instruction word rather than from the data RAM. Some very useful immediate instructions are "multiply immediate", "load accumulatory immediate" and "load auxiliary register immediate".

A parallel multiplier circuit 146 is capable of performing a 16×16 two's compliment multiplication in one 160 nano second instruction cycle. The 16 bit T register 148 temporarily stores the multiplicand. The P register 150 stores the 32 bit result. Multiplier values can either come from the data memory 130 or are derived immediately from "multiply immediate" instruction word. This fast on chip multiplier allows the processor to perform such fundamental operations as convolution, correlation and filtering at the rate of 3 million samples per second.

The output of multiplier 146 forms one input to a multiplex circuit 152. The other input of multiplex circuit 152 is the 32 bit output of a barrel shifter circuit 154. The barrel shifter is available for left shifting data 0 to 15 places before it is loaded into, subtracted from or added to the accumulator 156. The shifter extends the high bit of the data word and zero fills the low order bits for two's compliment arithmetic. A second shifter circuit 158 left shifts the upper half of the accumulator zero, one or four places, while it is being stored in the data RAM 130. Both shifters 154 and 158 are very useful for scaling and bit extraction.

The processor contains a 32 bit arithmetic logic unit 160 and an accumulator 156 that support double precision arithmetic. The unit 160 operates on 16 bit words taken from the data RAM 130 or derived from immediate instructions. Besides the usual arithmetic instructions, the unit can perform Boolean operations, providing the bit manipulation ability required of a high speed controller.

Figure 2:
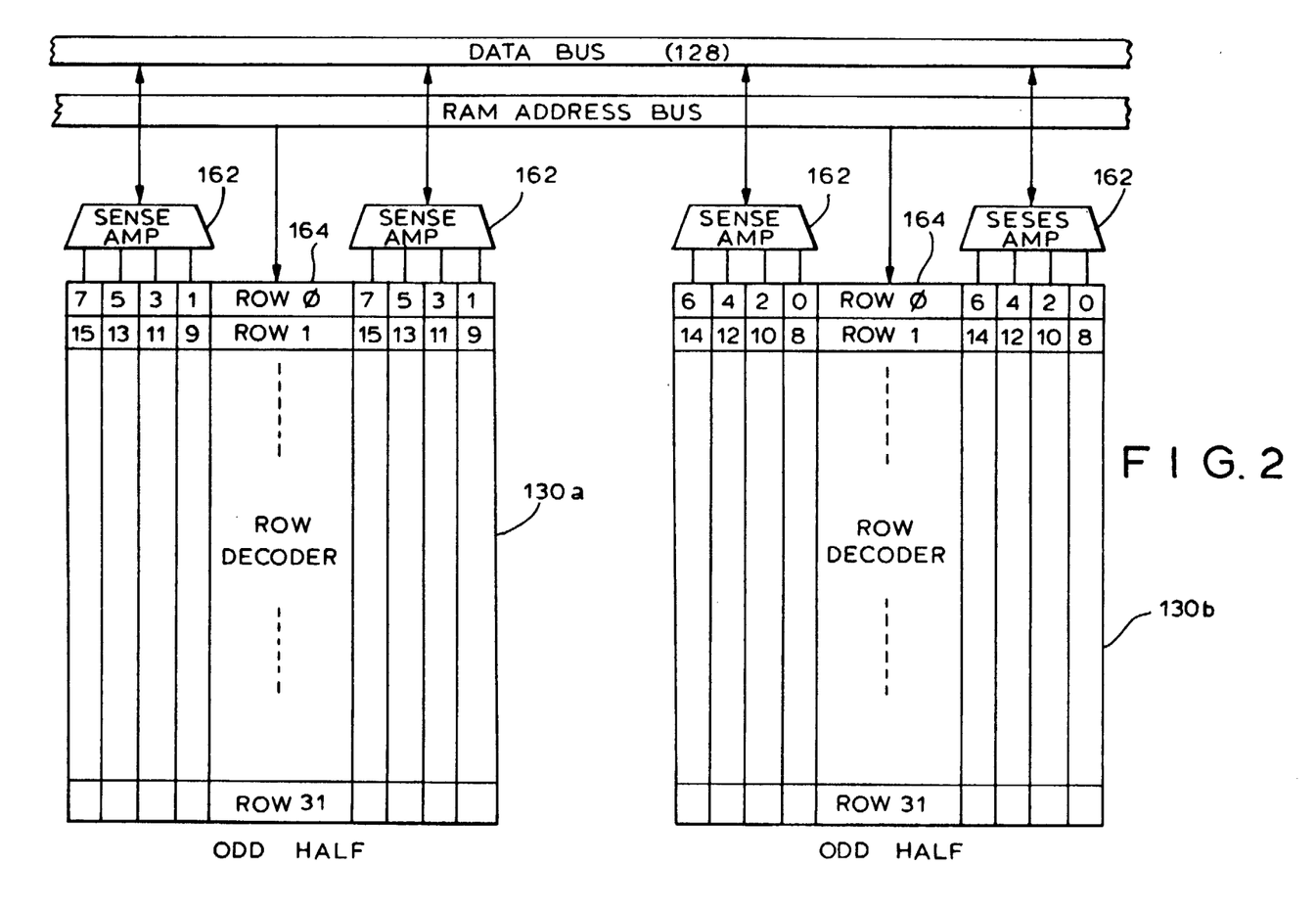
FIG. 2 is a block diagram illustrating the organization of the random access memory of the present invention.

FIG. 2 schematically illustrates the structure of data ROM 130. RAM 130 is divided into two halves, an odd half 130a which contains all odd address memory locations and an even half 130b which contains all even address memory locations. Each half contains 32 rows (row 0 thru row 31) and is further divided into a left portion and a right portion, each portion containing four columns. The left and right portions are separated by a column of row decoders 144 which are described in detail below. Each of the columns are connected to data bus 128 through a column decoder and sense amplifier circuit 162. The row decoder receives sets of row address signals from a RAM address bus which is the output multiplexer 136.

Figure 3:
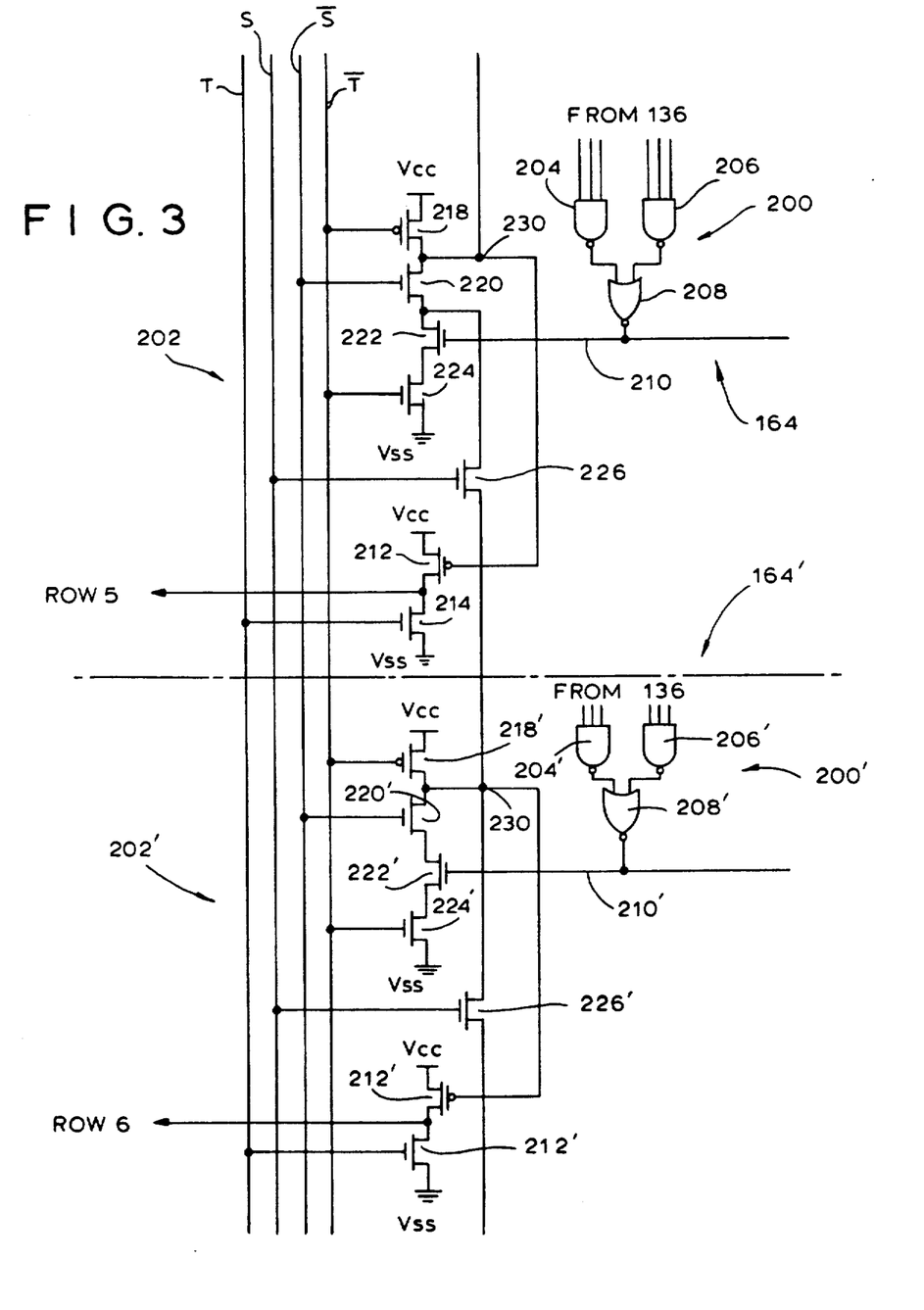
FIG. 3 is a schematic diagram of the left half of two typical row decoder circuits of the random access memory of the present invention, illustrating the row address gating circuits and row shift logic circuits.

FIG. 3 is a schematic diagram of two typical row decoder circuits 164, 164' associated with rows 4 and 5 of the memory respectively. Corresponding components of each decoder are referred to by the same number, with the components of the decoder 164 associated with row 5 being primed. In each case, the row address signal gating means, generally designated 200, 200' and one row indexing means, generally designated 202, 200' is illustrated. In reality, each row decoder circuit has two row indexing means, one which selects memory locations in columns to the left of the decoder and a second which selects memory locations in columns to the right. However, only the left row indexing means is illustrated for simplicity. Column decoders and associated circuiting are conventional and not shown. Column decoders associated with the memory location to be read and the location to be written are addressed simultaneously at the beginning of the time cycle in a conventional manner.

In each row decoder circuit, the row address signal gating means 200, 200' comprises first and second NAND gates, 204, 204' and 206, 206' each of which receives a set of row address signals from the RAM address bus 136. The outputs of NAND gates 204, 204' and 206, 206' form, respectively, the inputs of a NOR gate 208, 208'. The output of NOR gate 208 forms the row select input to the row indexing means 202, 202' on a bus 210, 210'.

Each of the row indexing means 202, 202' comprises seven transistors. The transistors are connected to a variety of inputs described in detail below, and also receive voltage from two sources designated Vcc and Vss. Vcc is a positive voltage, for example, 5 volts. Vss is ground.

Transistors 212, 212' and 214, 214' are complementary metal oxide semiconductor transistors each having a control terminal and an output circuit. The output circuits of these transistors are connected in series between Vcc and Vss. The junction between the output circuits of these transistors is connected to the row bus (row 5, row 6). The control terminal of transistor 214, 214' is connected to receive a first timing signal T.

Transistors 218, 218'; 220, 220'; 222, 222' and 224, 224' also have their output circuits connected in series between Vcc and Vss. Transistor 218, 218' is of the same type as transistor 212, 212' and hence complementary to transistors 220, 220'; 222, 222' and 224, 224'. The control terminal of transistor 212, 212' is connected to the junction between the output circuits of transistors 218, 218' and 220, 220'. It is also connected to the row select input 230, 230' which in turn is connected to the row selected output of the row decoder circuit associated with the previous row.

The control terminal of transistor 218, 218' is connected to receive the complement of the timing signal timing signal $\overline{T}$ as is the control terminal for transistor 224, 224'. The control terminal of transistor 220, 220' is connected to receive the complement of a shift signal $\overline{s}$, which, along with timing signals T, $\overline{T}$ and shift signal S are generated by controller 100. These signals are graphically illustrated on FIG. 4.

The junction between the output circuits of transistors 220, 220' and 222, 222' is connected through a seventh transistor 226, 226' to form the row select output of the row decoder circuit. The control terminal of transistor 226, 226' receives the shift signal S.

When no shift is required, that is, when the memory location selected for a reading in a "data move" instruction is in any column other than the last column of either the left or right part of the odd half of the memory, the shift signal S is inactive and the complement of the shift signal $\overline{S}$ is active. If the row address inputs are such that the output of the row address signal gating means 200, which appears on bus 210, is high, the output of all other row address signal gating means 200' will be inactive. Transistor 222 will be conductive and transistor 222' will be non-conductive. Since no shift signal is present, transistors 226 and 226' will be non-conductive and transistors 220 and 220' will be conductive.

During times $Q_1$ and $Q_3$ when the timing signal T is present, the row select inputs 230, 230' of the respective decoders are pulled up to the Vcc level through transistors 218 and 218', respectively. However, during times $Q_2$ and $Q_4$, when timing signal T is inactive, the row select input 230 is pulled down to Vss (ground) through transistors 220, 222 and 224, but the row select input 230' of the decoder circuit for row 6 will stay floating (holding its voltage at approximately Vcc level) because transistor 322' is non-conductive, shutting off the path to Vss (ground). Transistor 218' is non-conductive, shutting off the path to Vcc and transistor 226 is non-conductive shutting off the path to the previous row decoder circuit.

Since node 230 is at ground (high) and node 230' is at Vcc, the row bus (Row 6) associated with row 6 will be inactive (low) during time slots Q2 and Q4. The row buses (row 5 row 6) associated with rows 5 and 6 are always inactive in time slots Q1 and Q3 because transistors 214 and 214' are conductive because T is high, pulling the row buses to Vcc (ground). A high signal on a row bus indicates that the row has been selected.

When a row shift is required, that is, a memory location in the last column of a row in the odd sub-array has been addressed for reading in a data move instruction, the shift signal S̄ becomes active and the complement of the shift signal S is inactive. Transistors 226 and 226' become conductive and transistors 220 and 220' become non-conductive. If all of the other conditions are described above, then during time slots Q2 and Q4, node 230 will float and node 230' will be pulled to Vss (ground) through transistors 226, 222 and 224. This will turn on transistor 212' and cause row bus Row 6 to be active, that is at Vcc level, and hence the next row (row 6) has been automatically addressed for writing without the necessity of an additional set of row address signals.

Figure 4:
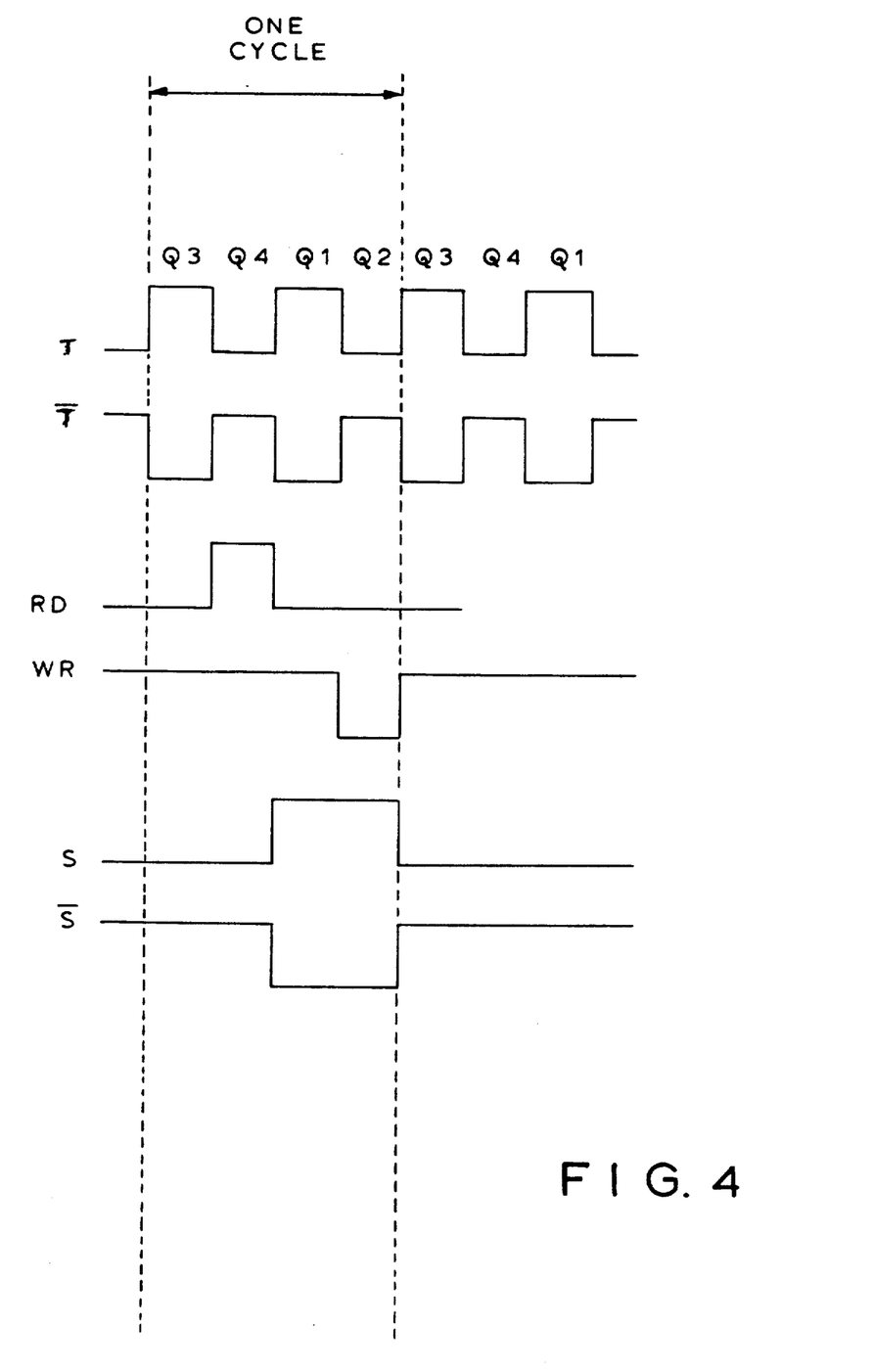
FIG. 4 is a timing diagram illustrating the relationship between the timing signals, read command signals, write command signals, and shift signals which operate row decoders of the present invention.

As illustrated in FIG. 4, which shows the timing, shifting and command signals, each cycle is divided into four slots Q1 through Q4. The RAM columns are precharged in Q1 and Q3. When the RAM is to be read or written into, Q4 is used for read and Q2 is used for write.

For a "data move" instruction, during the first half of the cycle (Q3-Q4), the shift signal S is inactive so the contents of the addressed location are read out on to the data bus. Since the RAM is split even and odds halves, for the "data move" instruction, the data is always written to a location in the half opposite to the one from where the data was read.

The write operation takes place in the second half of the cycle Q1-Q2. Adjacent row addressing is required only in the odd half of the sub-array and only when the column address is 7 (or 15 or 23 etc.). If such next row addressing is necessary, then during the second half of the cycle (Q1-Q2), the shift signal S is active.

It will now be appreciated that the present invention relates to a unique method and apparatus for controlling the movement of data in the random access memory of a digital signal processor which has a horizontally expanded and improved random access memory. The memory is divided into two halves, one of which contains even memory locations and the other which contains odd memory locations. The circuit is capable of executing a command for moving data from one half of the memory to the other in a single address cycle and hence maintains the high speed of the memory. Only a single set of row address signals need be decoded for the data move. The row decoder circuits includes automatic row shift logic. The automatic row shift logic causes the row address to shift from the last location in one row to the first location in the subsequent row when necessary.

While only a single preferred embodiment of the present invention has been disclosed for purposes of illustration, it is obvious that many variations could be made thereto. It is intended to cover all of these variations and modifications which fall within the scope of the present invention as defined by the following claims:

We claim:

1. An electronic processor in which data is cyclically processed, comprising:
    a semiconductor memory arranged and adapted to be read from and written to, including
        an array of memory cells arranged in rows and columns identifying memory locations of said semiconductor memory,
        each of said memory locations having a unique address,
        said array divided into a first half containing memory locations with even numbered addresses and a second half containing memory locations with odd numbered addresses,
    signal generating means electrically connected to said semiconductor memory for generating electrical shift signals to increment the addresses of said memory locations through a sequence of consecutively higher numbered addresses,
    selecting means for selecting an address designating a memory location from among the memory locations from which data is to be read,
    access means responsive to the selection of an address for reading data from the memory location designated by said selected address in one of said first and second halves during a predetermined instruction processing cycle of said electronic processor, and
    shift means responsive to an electrical shift signal generated by said signal generating means in response to the reading of data by said access means from said designated memory location for automatically writing data read from said designated memory location into the memory location in the other of said first and second halves of said array designated by the next sequentially higher address relative to said selected address during the same said predetermined instruction processing cycle.

2. A semiconductor memory, comprising:
    a first array of rows and columns encompassing all even numbered memory address locations,
    a second array of rows and columns encompassing all odd numbered memory address locations,
    means for reading data from a selected address location in a row of one of said first and second arrays during a predetermined cycle of operation of said memory,
    means for writing the data read from the selected address location into an address location in a row in the other of said first and second arrays, and
    means responsive to the reading of data from said selected address location for automatically incrementing the address of said memory to cause said writing means to write the same data read from said selected address location into the next sequentially higher address location of said other of said first and second arrays during a single predetermined instruction cycle of said memory operation in which said reading of data occurred.

3. The method of claim 2, further including:
    means for causing the data reading means to select the address location in the next row for the next readout of data after the data in the last address location of a row has been read.

4. A method for transferring data between address locations of a semiconductor memory, comprising:

partitioning said memory into first and second halves one of which contains all odd numbered address locations and the other of which contains all even numbered address locations of the memory, reading data from a selected address location in one of said halves during an instruction cycle of operation, and incrementing the addresses of said memory such that the same data which was read from the selected address location is written into the next sequentially higher address location of said memory in the other of said halves during a single instruction cycle of operation in which both reading from and writing into the respective halves of said memory takes place.

* * * * *